(12) United States Patent
Kister

(10) Patent No.: US 6,525,552 B2
(45) Date of Patent: Feb. 25, 2003

(54) MODULAR PROBE APPARATUS

(75) Inventor: January Kister, Redwood City, CA (US)

(73) Assignee: Kulicke and Soffa Investments, Inc., Wilmington, DE (US)

( * ) Notice: Subject to any disclaimer, the term of this patent is extended or adjusted under 35 U.S.C. 154(b) by 0 days.

(21) Appl. No.: 09/854,152

(22) Filed: May 11, 2001

(65) Prior Publication Data

US 2002/0167328 A1 Nov. 14, 2002

(51) Int. Cl.⁷ .............................................. G01R 31/02
(52) U.S. Cl. .................................. 324/754; 324/158.1
(58) Field of Search .............................. 324/754, 158.1, 324/758, 757, 761, 762, 763; 439/141, 331; 438/14, 18

(56) References Cited

U.S. PATENT DOCUMENTS

| 5,534,784 A | 7/1996 | Lum et al. ................... 324/757 |
| 6,420,888 B1 * | 7/2002 | Griffin et al. ................ 324/754 |
| 6,441,621 B2 * | 8/2002 | Nagata ........................ 324/537 |
| 6,441,629 B1 * | 8/2002 | Khoury et al. .............. 324/754 |

\* cited by examiner

*Primary Examiner*—Michael Sherry
*Assistant Examiner*—Jimmy Nguyen
(74) *Attorney, Agent, or Firm*—Lumen Intellectual Property Services, Inc.

(57) ABSTRACT

A probe apparatus is provided with a number of space transformer segments that are fixated such that probe offset due to warping is kept to a minimum. In a first embodiment, the space transformer segments are permanently fixated. In a second embodiment the space transformer segments are included together with correspondingly shaped sheath segments in probe modules that may be individually removed from the probe apparatus for a selective maintenance. As a result a large number of chips may be tested simultaneously without reducing the operational cycle interval of the probe apparatus.

17 Claims, 6 Drawing Sheets

MODULAR PROBE APPARATUS

FIELD OF INVENTION

The present invention relates to space transformer configurations of chip testing probe apparatus. Particularly, the present invention relates to a probe apparatus having a segmented space transformer.

BACKGROUND OF INVENTION

The demand for reduced test cycle times during the chip fabrication results in development of probe apparatus that are capable of testing an increasing number of chips simultaneously. Chips are conventionally fabricated and tested on wavers. For a given chip size, the waver diameter defines the maximum number of chips that can be simultaneously fabricated on a single waver. On the other hand, the maximum number of simultaneously tested chips is mainly restricted by the configuration of the probe apparatus.

Conventional probe apparatus have a number of probes configured and uniformly assembled in order to evenly contact a number of chip terminals. The maximum number of probes feasibly combined in such probe apparatus depends on a number of factors, which are, for example, a probe failure likelihood opposed by a required probe apparatus life span or, in another example, position tolerances of all the probes' tips within the probe assembly.

Probe failure likelihood may be statistically defined as an average failure rate per probe and test cycle. Multiplying the number of assembled probes with the average failure rate results in an average probe apparatus cycle interval during which the probe apparatus may be operated uninterrupted. The repair of individual probes within a conventional probe assembly is highly unpractical due to the fragile nature of probes and the tight probe assembly. In cases where individual probe tips become offset relative to the probe tip plane, grinding and/or sanding operations have to be performed on all probes in order to bring them again into common alignment. Thus increasing the number of probes increases also the maintenance and repair effort between the cycle intervals.

Position tolerances of all the probe tips within the probe assembly are crucial for establishing and maintaining identical contacting conditions between the individual probe tips and the terminals of the tested chips. In-plane position tolerances affect the position of the probe tips relative to the corresponding terminals. Off-plane position tolerances affect the contacting force with which the probes are pressed against the terminals. In-plane and off-plane position tolerances are defined by a fabrication precision and a thermal expansion behavior of the probe apparatus. Since chips are tested at various elevated temperatures, probe apparatus are exposed to varying thermal conditions during their operation. With increasing size of the probe apparatus temperature discrepancies within the probe apparatus become more difficult to control. In addition, individual components of the probe apparatus have dissimilar expansion characteristics, which results in warping and consequently in an increased off-plane position range of the probe tips.

Space transformers that are made from two or more layers of different materials are especially sensitive to warping. Warping of space transformers increases more than proportional with the size of space transformer and is thus a main limitation of probe apparatus sizes for given probe tip position tolerances.

For simultaneously testing extended numbers of chips, there exists therefore a need for a probe apparatus in a configuration that bypasses the limitations imposed by probe failure likelihood and space transformer warping. The present invention addresses this need.

The U.S. Pat. No. 5,534,784, for example, discloses a probe apparatus having more than one space transformers on top of each other. The invention does not disclose laterally arranged space transformer segments.

SUMMARY

A probe apparatus is introduced that combines a number of laterally arranged probe blocks in a modular assembly within a frame structure.

In the preferred embodiment, the probe blocks include space transformer segments that are configured, laterally arrayed and fixated within the frame structure such that the off-plane position range of the probe tips remains only affected by the warping of the individual space transformer segments. In addition, the frame structure may have thermal distribution characteristic defined such that temperature discrepancies of the individual space transformer segments remain within a predetermined range for a given operation environment.

In a second embodiment of the present invention the probe modules include space transformer segments, corresponding probes and a guiding structure for glidingly fixating the corresponding probes. The frame structure may provide features for fixating and removing the probe modules in order to replace individual probe modules within the probe apparatus in cases of probe failure or other factors like, for example, partial change of the chip layout of the waiver series to be tested. As a result, the number of probes within the probe apparatus may be selected independently from the average probe failure likelihood and the probe apparatus may be more easily configured and adjusted to varying chip production cycles.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

Figure 1:
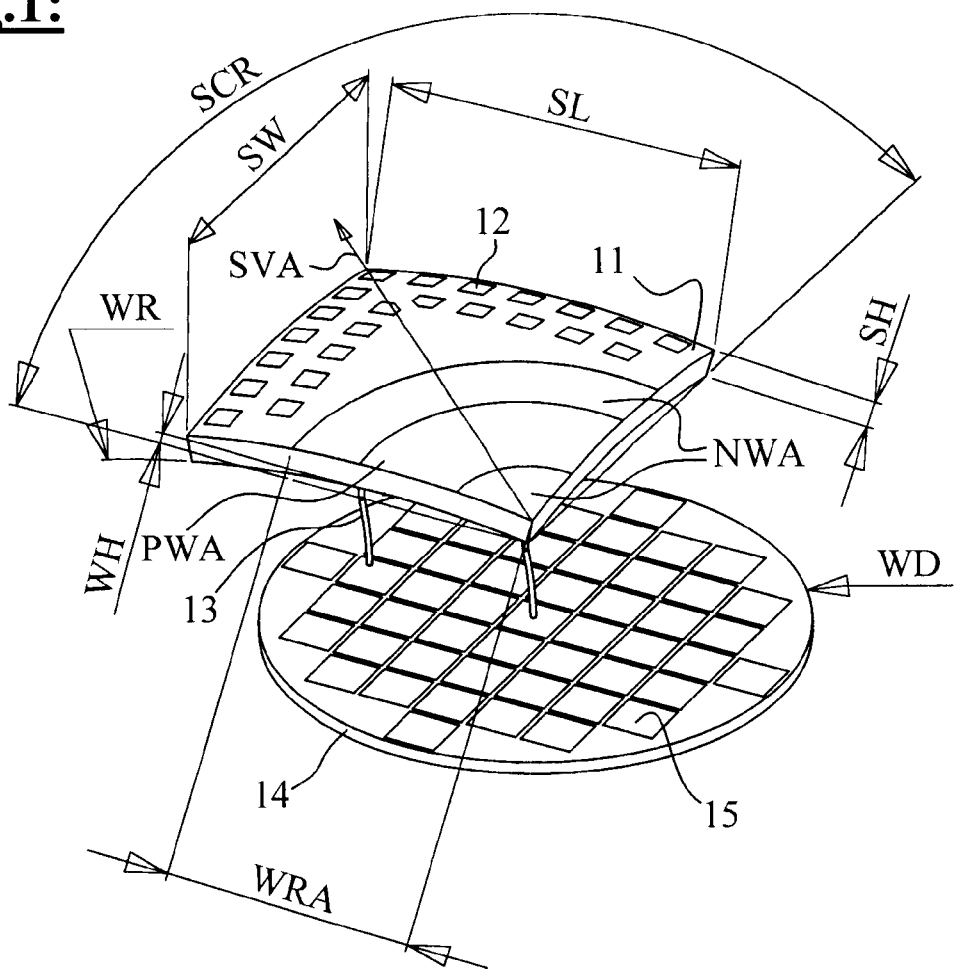
FIG. 1 shows an isometric view of a single space transformer segment above a tested waiver.

FIG. 1 shows the space transformer segment 11 with the peripheral terminals 12 above a tested waiver 14 with the chips 15. The transformer segment 11 is shown in a simplified fashion and in an exemplary position relative to the waiver 14. The exemplary position corresponds to a testing position of a probe apparatus PA (see FIGS. 2, 3, 5) featuring a number of space transformer segments 11, 11B, 1C, 11D as it is partially shown in the FIGS. 2–5. The testing position is the position of the probe apparatus PA during which up to all chips 15 of the waiver 14 may be simultaneously accessed by the probes 13, 13B, 13C, 13D as shown in the FIGS. 2–5. For the purpose of clarity, only a view probes 13, 13B, 13C, 13D are shown in the FIGS. 2–5. It is clear to one skilled in the art that the probes 13, 13B, 13C, 13D may be in any number as is commonly practiced for testing circuit chips.

The probe apparatus PA shown in the FIGS. 2–5 is presented in simplified form solely for the purpose to illustrate the main inventive features that would enable one skilled in the art to make and use the invention. For example, in FIGS. 2–5, four space transformer segments 11, 11B, 11C, 11D are shown in circular arrangement with corresponding rectangular contour indicated in FIG. 1 by the segment length SL, the segment width SW and the segment height SH. It is noted, that the scope of the invention is not limited to the number of segments or geometric orientation of the individual segments relative to each other. Moreover, the segments may be arranged in any number and geometric configuration suitable to accomplish the inventive goals as set forth in the following detailed description. For example, the segments may be arranged in the number of three, each of them having a triangular contour or a tart shape.

The main task of a space transformer is to provide peripheral terminals 12, 12B, 12C, 12D in a larger scale than the terminals or vias contacted by the probe ends such that cables can be attached to them. In the present invention where a number of space transformer segments 11, 11B, 11C, 11D are laterally arranged the up scaling of the peripheral terminals 12, 12B, 12C, 12D is in radial direction away from the testing area center TAC (see FIG. 4). The up scaling within the space transformer segments 11, 11B, 1C, 11D may be accomplished within a scaling range SCR, which is defined by the number of segments circularly arranged around the testing area center TAC. For the example illustrated in the FIGS. 2–5 the scaling range may be up to 90°. The scaling range SCR is averaged by the scaling vectors SVA, SVB, SVC, SVD (see FIGS. 1, 2, 4).

Space transformer segments 11, 11B, 11c, 11D may have to withstand the contacting forces of the individual beams that are brought into contact with the test terminals. This applies particularly for buckling beam probes as is well known to those skilled in the art. The space transformer segments 11, 11B, 11C, 11D provide also a number of conductive layers alternating with insulating layers. This is to provide the conductive traces that connect the peripheral terminals 12, 12B, 12C, 12D with the probe terminals or probe vias that are arrayed on the bottom side space transformer segments 11, 11B, 11C, 11D. As a result, the space transformer segments 11, 11B, 11C, 11D have to have a certain segment height SH as is well known for conventional space transformers.

Circuit chips are commonly tested at elevated temperatures, which induces a thermal load onto the space transformer segments 11, 11B, 1C, 1D. Since the thermal load induced on the space transformer segments 11, 11B, 11C, 11D is difficult to be fully balanced, warping of the space transformer segments 11, 11B, 11C, 11D is unavoidable. Warping of the space transformer segment 11 is exemplarily shown in FIG. 1 with the warping radius WR and the warping height WH.

In a case where all chips 15 of a waiver 14 are tested simultaneously, the space transformer segments 11, 11B, 11C, 11D significantly extend laterally beyond a warping relevant area WRA where probe beams are contacting the space transformer segments 11, 11B, 11C, 11D. In this case, the warping relevant area WRA corresponds approximately with the waiver diameter WD. For the purpose of simplicity, the warping relevant area WRA as well as a negative warping area NWA and a positive warping area PWA are illustrated on the top surface of the space transformer segment 11. It is clear that the warping relevant area WRA, the negative warping area NWA and the positive Warping area PWA are of relevance on the bottom surface of the space transformer segments 11, 11B, 11C, 11D.

The positive warping area PWA may be an area on the bottom side of the space transformer segments 11, 11B, 11C, 11D, at which a warping movement of the space transformer segments 11, 11B, 1C, 11D results in an distance increase in perpendicular direction away from the waiver 14. The negative warping area NWA may be an area on the bottom side of the space transformer segments 11, 11B, 11C, 11D, at which a warping movement of the space transformer segments 11, 11B, 11C, 11D results in an distance decrease in perpendicular direction towards the waiver 14. The space transformer segments 11, 11B, 11C, 11D are preferably fixated within the probe apparatus PA such that the positive and negative warping areas NWA and PWA have approximately the same area. As a result, the maximum length offset due to warping within the warping relevant area WRA is kept to a minimum. A peripheral region of the space transformer segments 11, 11B, 11C, 11D that carry solely peripheral terminals 12 on their top surface may experience increased vertical displacement which is of no influence to the off-plane tolerance within which the probe tips may be contacted for a given operational thermal bandwidth of the probe apparatus PA.

Figure 2:
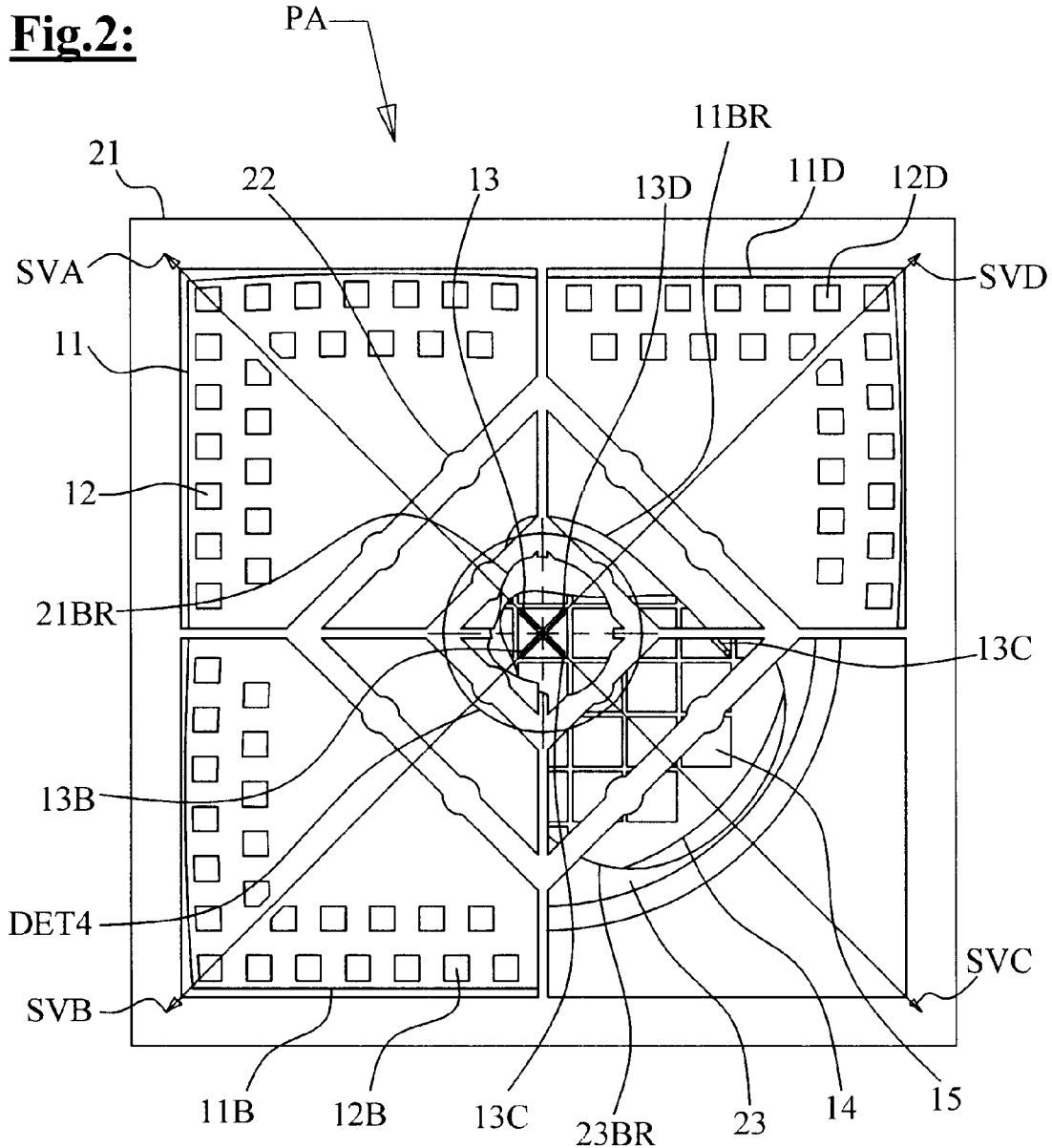
FIG. 2 shows a top view of an exemplary and simplified probe apparatus having four space transformer segments with one space transformer segment not being shown. The exemplary probe apparatus is shown above a tested waiver.

FIG. 2 shows a top view of the simplified probe apparatus PA with the four space transformer segments 11, 11B, 11C, 11D (space transformer segment 11C is not shown) being fixedly held within the segment fixating areas 22 provided by the segment fixating frame 21. The segment fixating frame 21 may be configured to provide sufficient space for a lateral thermal expansion of the space transformer segments 11, 11B, 11C, 11D in direction of their scaling vectors SVA, SVB, SVC, SVD.

The probe apparatus PA is broken along a number of breaking lines in order to better illustrate the vertical arrangement of the individual components. The segment fixating frame 21 is broken along the frame breaking line 21BR (see also FIG. 4), the space transformer segments 11, 11B, 11C, 11D are broken along the segment breaking line 11BR (see also FIG. 4) and the sheath 23 of the probe apparatus PA is broken along the sheath breaking line 23BR (see also FIG. 4). As a result, the probes 13, 13B, 13C, 13D are visible in their operational position and orientation as well as the chips 15 on the waiver 14.

Figure 3:
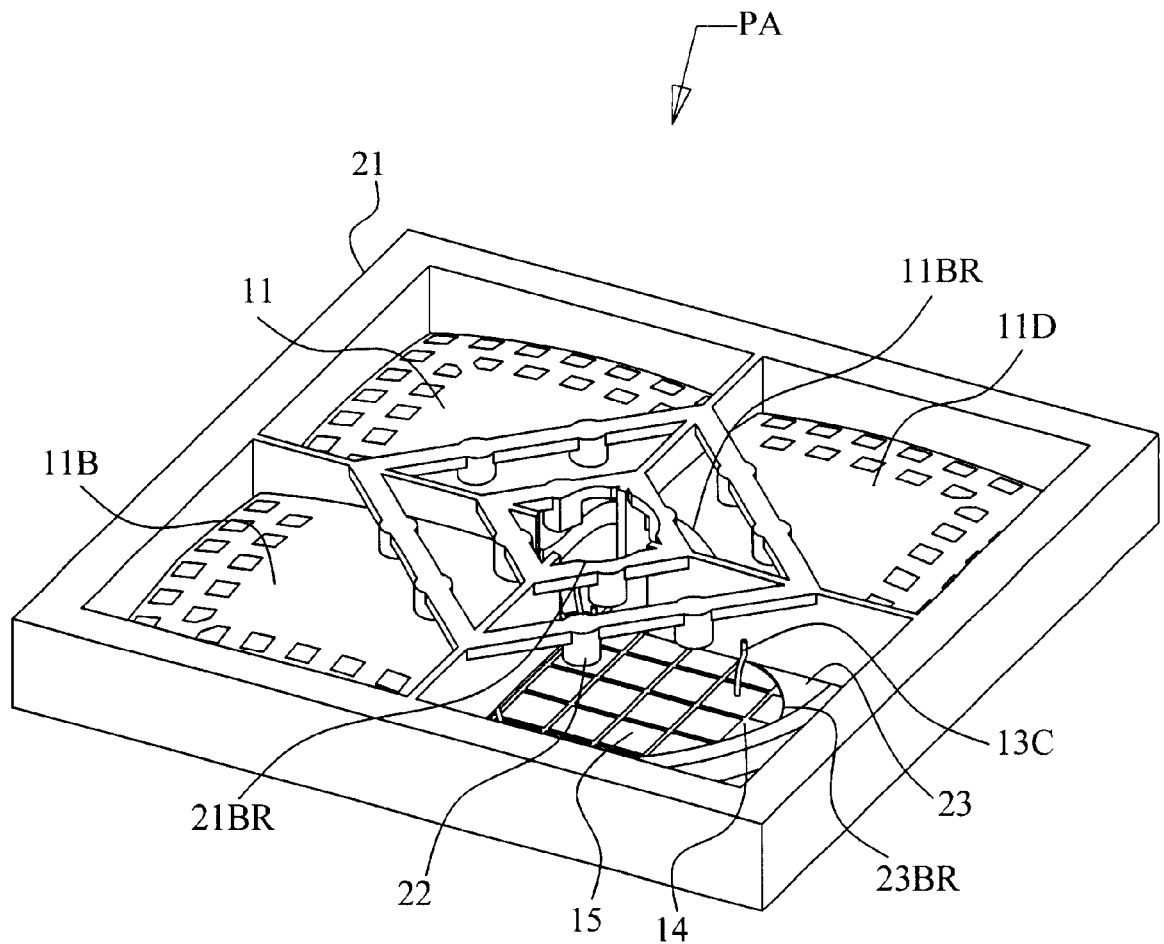
FIG. 3 shows the exemplary probe apparatus of FIG. 2 in isometric view.

FIG. 3 shows the probe apparatus PA in isometric view in order to clearly illustrate the vertical arrangement of the individual elements and the breaking lines.

In a first embodiment of the present invention, the space transformer segments 11, 11B, 11C, 11D are rigidly connected with the probe apparatus PA.

Figure 4:
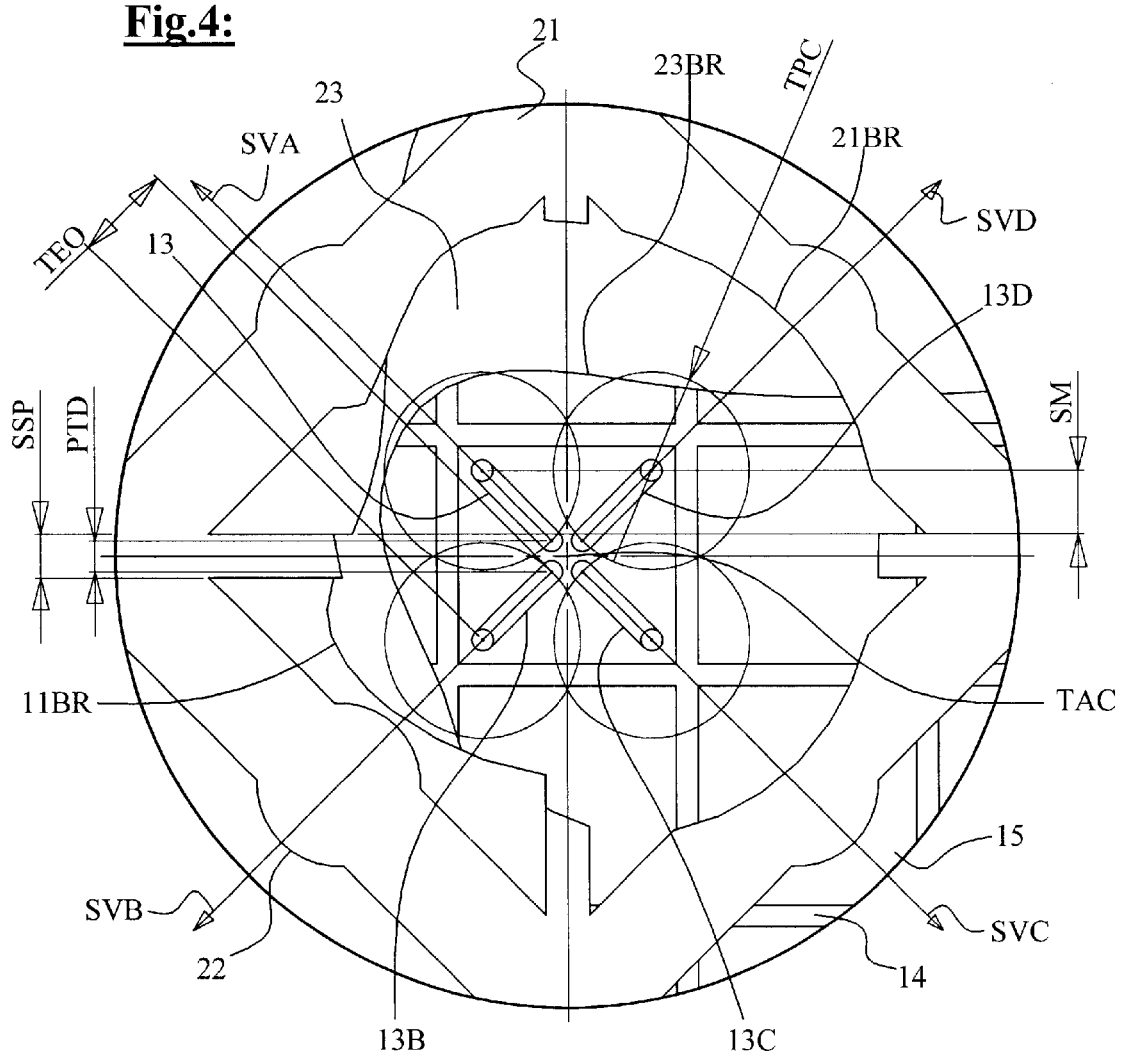
FIG. 4 shows an enlarged detail of the probe apparatus of FIG. 2 The enlarged detail is indicated in FIG. 2.

FIG. 4 shows an enlarged detail view of the central detail of the probe apparatus PA as is indicated in FIG. 2 with the circle DET4.

The space transformer segments 11, 11B, 11C, 11D may have their probes 13, 13B, 13C, 13D commonly aligned such that all probe tips of a single space transformer segment point into a common direction relative to their probe ends. Particularly in the case where buckling beam probes are utilized the probes 13, 13B, 13C, 13D have a probe tip/end offset TEO which is the lateral offset between their tips and their ends. The probes 13, 13B, 13C, 13D may thus be oriented with their tips on their tip position circle TPC for a given probe end position on their space transformer segments 11, 11B, 1C, 1D.

Test terminals (not shown) on the chips 15 may be in a distance to each other, which has to be matched by the probe tip distance PTD. On the other hand, the space transformer segments 11, 11B, 1C, 11D may have to be assembled within the probe apparatus PA with a segment assembly gap SSP. In addition, the probe ends may only be contacting their terminals or vias up to the segment margin SM. Consequently, for a given required probe tip distance PTD along the segment assembly gap SSP, the sum of the segment assembly gap SSP and the segment margin SM may have to be equaled the sum of probe tip distance PTD plus the probe tip/end offset TEO under consideration of the scaling range SCR. This relation is formulated in mathematic terms as follows:

$$SM + SSP/2 = PTD/2 + TEO * \sin SCR/2$$

Figure 5:
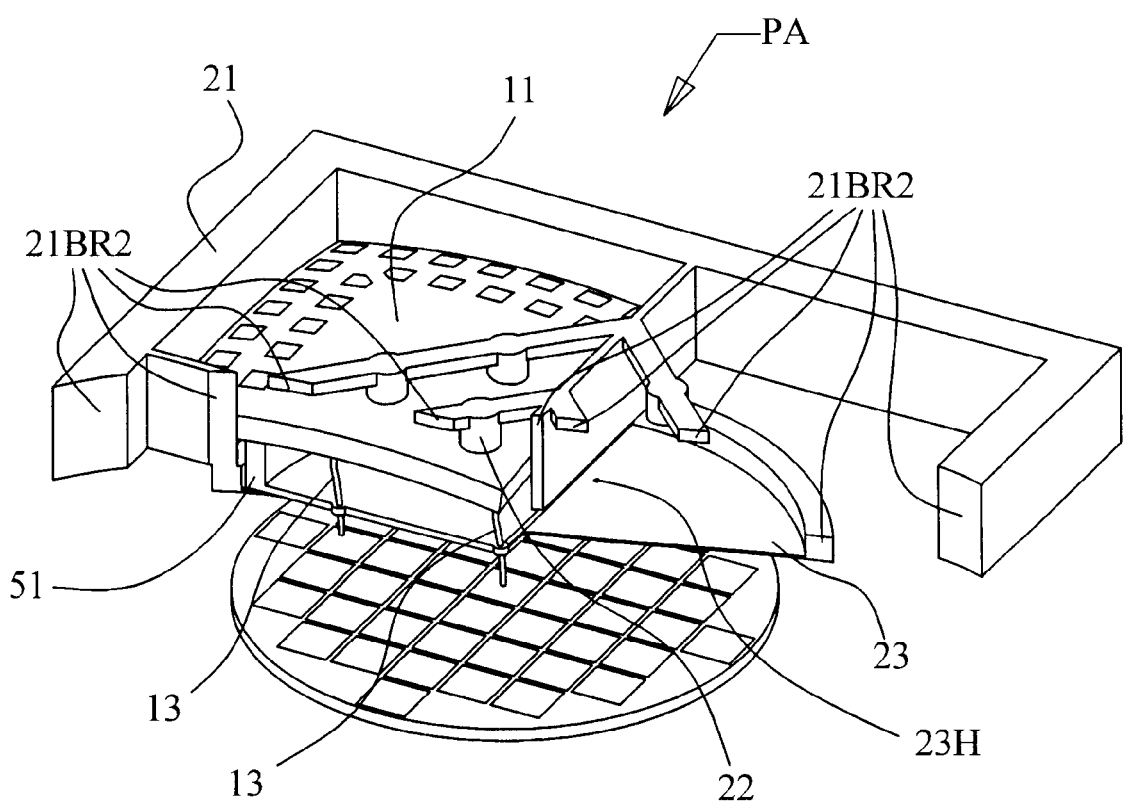
FIG. 5 shows the isometric view of FIG. 3 of the probe apparatus of FIG. 2 completely broken along the probe breaking line.

FIG. 5 shows a section view of the probe apparatus PA cut along a section line resulting in the cut sections 21BR2. FIG. 5 shows a second embodiment of the present invention where the space transformer segment 11 is included with the module sheath 51 and the probes 13 in a probe module that may be disassembled as a whole. The segment fixating areas 22 comprise for that removable fixtures like, for example, alignment bolts together with screws. As a result, the probes 13 may be maintained independently from the probes 13B, 13C, 13D. The segment fixating areas 22 may further comprise vertical adjustment features like, for example adjustment screws for independently positioning the probe module in vertical and/or lateral direction such that sanding operations may be performed. A shortening of the probes 13 resulting from the sanding may be compensated by resetting the adjustment features.

Figure 6:
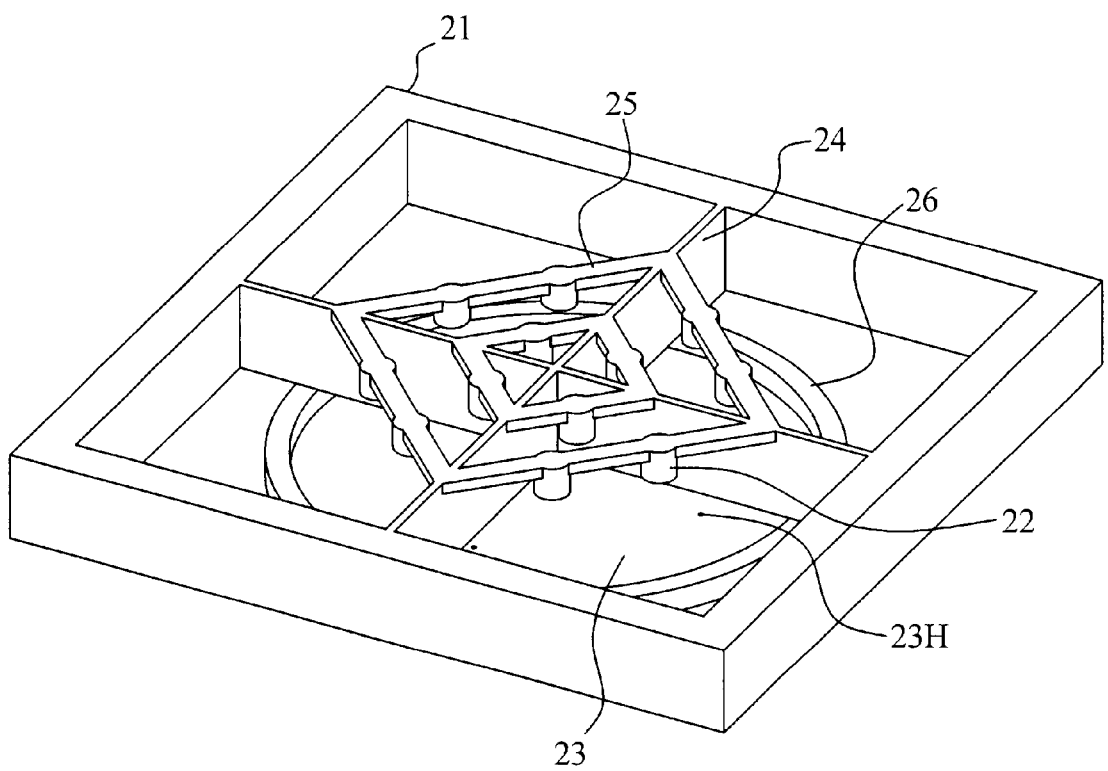
FIG. 6 shows the isometric view of FIG. 3 of the segment fixating frame.

FIG. 6 shows the segment fixating frame 21 which may have thermal distribution features 24 and/or thermally decoupled carrying features 25. The distribution features 24 may be of a shape and material to balance the thermal load throughout the a relevant region of the segment fixating frame 21 which may correspond to the warping relevant area WRA. The carrying features 25 may be configured and positioned to be insulated from the thermal load in order to prevent thermally related deformation of them.

The segment fixating frame 21 may also include a sheath holding feature 26.

Accordingly the scope of the invention described in the specification above is set forth be the following claims and their legal equivalent.

What is claimed is:

1. A space transformer segment comprising an array of contacting means arrayed on a surface of said space transformer segment, said array being positioned in a distance to an edge of said surface dedicated to face a corresponding edge of another space transformer segment when assembled in a probe apparatus, said distance being defined in correspondence to:

i. a segment assembly gap of a number of assembly locations for said space transformer segment within said probe apparatus;

ii. a probe tip/end offset of a buckling beam probe configured to contact at least one of said contacting means and a test terminal of a chip positioned on a waiver.

2. The space transformer segment of claim 1, wherein said array is provided by a number of packages fixated on a subsidiary space transformer, and wherein at least one of said number of packages is configured to permanently contact said chip in operational configuration.

3. The space transformer segment of claim 2, wherein said subsidiary space transformer is made of ceramics.

4. The space transformer segment of claim 1 further comprising:

a. a thermal warping characteristic for a given operational thermal exposure within said probe apparatus;

b. segment fixating area for fixating said space transformer such that a positive warping area essentially equals a negative warping area within a warping relevant area of said space transformer segment.

5. A probe apparatus comprising space transformer segments, each of said space transformer segments comprising an array of contacting means arrayed on a bottom surface of each said space transformer segments, said array being positioned in a distance to an edge of said surface facing a corresponding edge of another of said number of space transformer segments laterally assembled in said probe apparatus, said distance being defined in correspondence to:

i. a segment assembly gap of a number of assembly locations for said space transformer segment within said probe apparatus;

ii. a probe tip/end offset of a buckling beam probe configured to contact at least one of said contacting means and a test terminal of a chip positioned on a waiver.

6. The probe apparatus of claim 5 further comprising a beam probes bundled in commonly aligned beam groups, at least one of said commonly aligned beam groups being commonly aligned in essentially opposing direction of a scaling vector of one of said space transformer segments.

7. The probe apparatus of claim 5 further comprising a segment fixating frame configured to laterally fixate said space transformer segments within said probe apparatus, said fixating frame comprising at least one group of fixating means corresponding to fixating features of said at least one of said space transformer segments.

8. The probe apparatus of claim 7, wherein said fixating means are positioned such that a positive warping area essentially equals a negative warping area within a warping relevant area of said at least one of said space transformer segments.

9. The space transformer segment of claim 5, wherein said array is provided by a number of packages fixated on a subsidiary space transformer, and wherein at least one of said number of packages is configured to permanently contact said chip in operational configuration.

10. The space transformer segment of claim 9, wherein said subsidiary space transformer is made of ceramics.

11. A probe apparatus comprising probe modules, each of said probe modules comprising:

a. a space transformer segment comprising an array of contacting means arrayed on a bottom surface of each said space transformer segments, said array being positioned in a distance to an edge of said surface facing a corresponding edge of another of said number of space transformer segments laterally assembled in said probe apparatus, said distance being defined in correspondence to:

i. a segment assembly gap of a number of assembly locations for said space transformer segment within said probe apparatus;
ii. a probe tip/end offset of a buckling beam probe configured to contact at least one of said contacting means and a test terminal of a chip positioned on a waiver;
b. a beam probe bundle commonly aligned in essentially opposing direction of a scaling vector of said space transformer segment; and wherein said scaling vectors point in radial direction away from a testing area center.

12. The probe apparatus of claim 11 further comprising a module fixating frame configured to laterally fixate said space transformer segments within said probe apparatus, said fixating frame comprising at least one group of fixating means corresponding to fixating features of said at least one of said space transformer segments.

13. The probe apparatus of claim 12, wherein said fixating means are positioned such that a positive warping area essentially equals a negative warping area within a warping relevant area of said at least one of said space transformer segments.

14. The probe apparatus of claim 12, wherein said fixating means are configured to removable fixate said space transformer segments.

15. The probe apparatus of claim 14, wherein at least one of said probe modules further comprise a module sheath for independently holding said beam probe bundle in position during disassembly of said at least one probe module.

16. The space transformer segment of claim 11, wherein said array is provided by a number of packages fixated on a subsidiary space transformer, and wherein at least one of said number of packages is configured to permanently contact said chip in operational configuration.

17. The space transformer segment of claim 16, wherein said subsidiary space transformer is made of ceramics.

* * * * *